United States Patent [19]

Joly et al.

[11] 4,025,404
[45] May 24, 1977

[54] OHMIC CONTACTS TO THIN FILM CIRCUITS

[75] Inventors: Jean Joly; Jean Bernard Ranger, both of Paris Cedex, France

[73] Assignee: Societe Lignes Telegraphiques et Telephoniques, Paris, France

[22] Filed: Nov. 4, 1975

[21] Appl. No.: 628,846

[30] Foreign Application Priority Data

Nov. 6, 1974 France ............................. 74.36805

[52] U.S. Cl. ............................. 204/38 B; 29/621;
204/192 F; 204/298; 427/103; 338/309;
338/327

[51] Int. Cl.² .................... C25D 5/00; C23C 15/00;
H01H 37/36

[58] Field of Search ............ 204/192, 38 B; 29/619,
29/621; 427/88, 89, 91, 103; 338/327, 328,
309; 156/11

[56] References Cited

UNITED STATES PATENTS

| | | | |
|---|---|---|---|
| 3,370,262 | 2/1968 | Marty et al. | 338/309 |
| 3,616,406 | 10/1971 | Turner | 204/192 |
| 3,793,175 | 2/1974 | Joly et al. | 204/192 |
| 3,864,180 | 2/1975 | Barraclough | 156/3 |
| 3,907,620 | 9/1975 | Abraham et al. | 156/11 |
| 3,921,200 | 11/1975 | Pille | 357/67 |

OTHER PUBLICATIONS

S. S. Lau, "The Use of Sputtered Conductor Materials in Film Integrated Circuits," Thin Solid Films, vol. 14, pp. 87–103 (1972).

W. D. Westwood et al., "Tantalum Thin Films," Academic Press, 1975, pp. 282–288.

Primary Examiner—John H. Mack
Assistant Examiner—Aaron Weisstuch
Attorney, Agent, or Firm—Kemon, Palmer & Estabrook

[57] ABSTRACT

A process for establishing gold contact studs on thin film circuits consists in localized sublayer deposition of a platinum-gold alloy followed by subsequent electrolytic gold thickening of the studs. The studs so produced are particularly fit for thermocompression interconnection.

6 Claims, 5 Drawing Figures

OHMIC CONTACTS TO THIN FILM CIRCUITS

BACKGROUND OF THE INVENTION

The present invention relates to an improved process for establishing ohmic contacts or studson thin films of metals or metal compounds such as, for example, nitrides. The problem of establishing ohmic contacts on thin films (the maximum thickness of which is a few tenths of micrometers) is generally solved by the localized desposition of metal or of a metal alloy such as gold or alloys of nickel and chromium, as is in fact well known. Among known processes, mention may be made of those requiring a relatively large number of intermediate layers or films between the thin film circuit and the metal stud. By way of example, solutions have been described utilizing intermediate layers of titanium and palladium. A simpler solution of establishing ohmic contacts on layers of tantalum nitride is disclosed in U.S. Pat. No. 3,793,175 granted to the same assignee.

The problem involved in the establishment of these contacts is relatively complex due to the mounting requirements of these circuits. It is in fact most frequently required that the interconnections of these circuits be established by thermocompression or by means of gold eutectic alloys. In specific cases, it is required that tin soldering should be possible.

The present invention affords a solution of this problem which is particularly interesting in the case of tantalum nitride thin film circuits. It permits, in fact, the reduction within a factor higher than 2 of the quantity of gold necessary for thermocompression interconnecting. It also permits an improvement in the yield of the thermocompression step and also an improvement in the ageing ratio.

SUMMARY OF THE INVENTION

The process is essentially characterized by the use, at the contact location, of a single adhesion sublayer obtained by cathode sputtering of a platinum-gold alloy, the contact stud being produced with the aid of a subsequent thick film of gold. This thick layer or film of gold is (as is conventional) obtained by an electrolytic process.

According to a preferred mode of carrying the process into effect, the platinum-gold alloy comprises between 5 and 10% of platinum and the thickness of the adhesion sublayer ranges between 0.1 and 0.2 micrometer.

From the production aspect, the utilization of a single contact sublayer affords noteworthy simplification of the process for the manufacture of the circuits. On the other hand, the technology used for depositing the said sublayer is particularly advantageous in the case of tantalum nitride circuits, since the films constituting the circuit are generally obtained by reactive cathode sputtering. The circuit and the contact sublayer may thus be produced successively in the same cathode sputtering assembly comprising two targets relating, one to the circuit and the other to the sublayer. Such an apparatus is commercially available.

An important advantage of the process according to the invention resides in that it has been found that the subsequent gold stud thickness necessary for thermocompressed interconnections may be reduced by approximately 50% relative to the thickness of the gold stud necessary for obtaining analogous results according to prior art practive. It has, in fact, been found that a thickness of the gold stud of 0.5 micrometer permits thermocompression in industrial production with a good yield, whereas in the case of adhesion sublayers of some other nature a 1 micrometer stud must generally be utilized. Similarly, the thickness of the adhesion sublayer is smaller than that which is generally required according to prior art practice. This feature makes it possible to reduce the duration of the cathode sputtering production step or to increase the production rate.

DETAILED DESCRIPTION OF THE INVENTION

Figure 1:
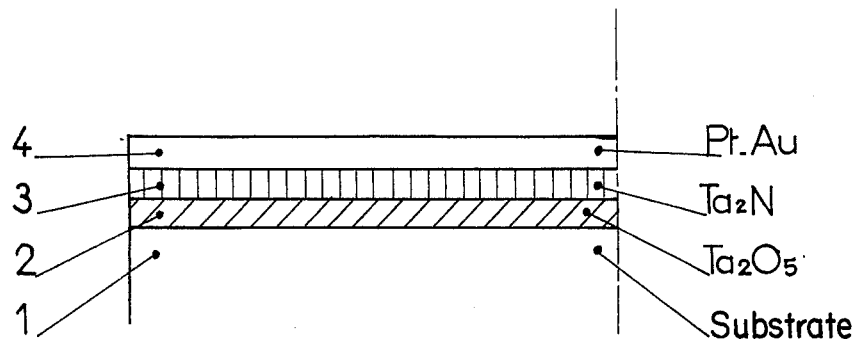
Figure 2:
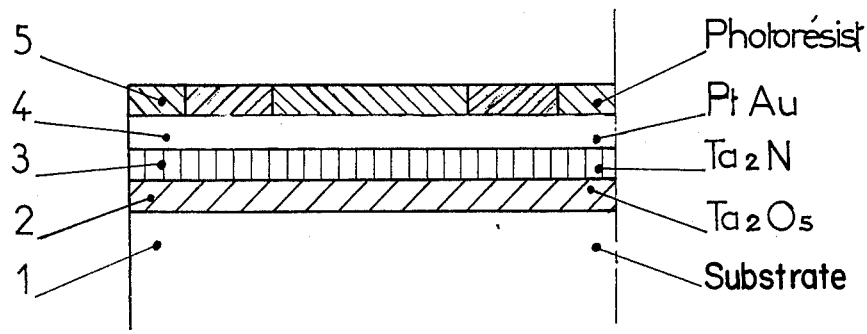
Figure 3:
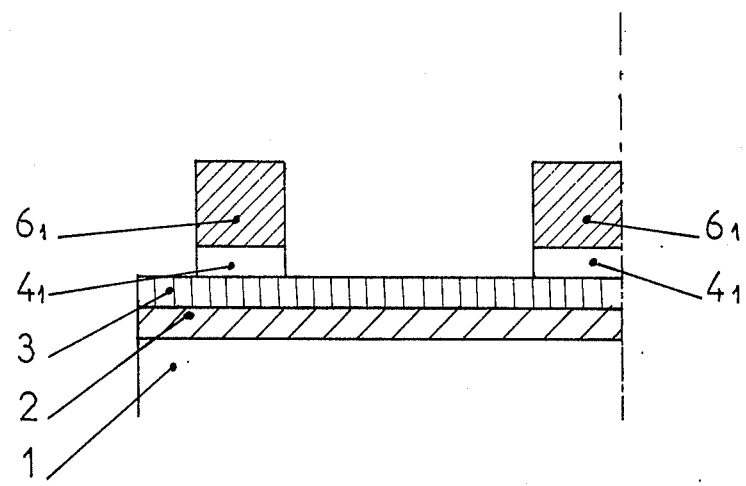
Figure 4:
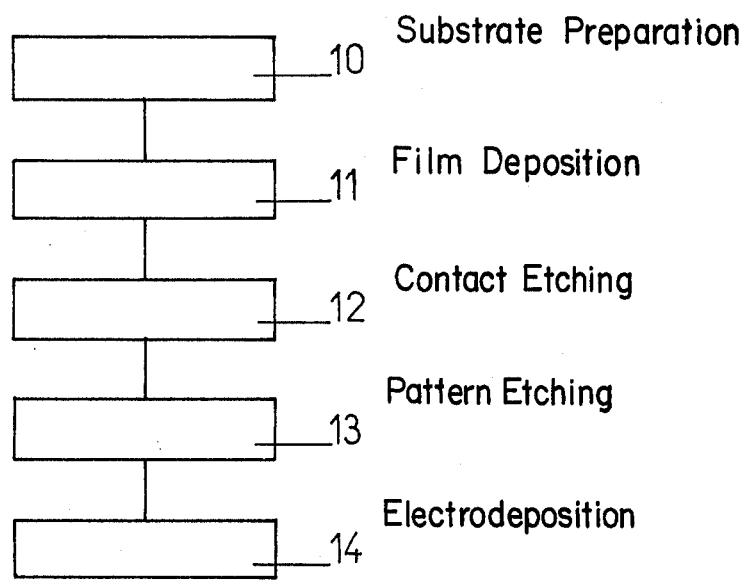
Figure 5:
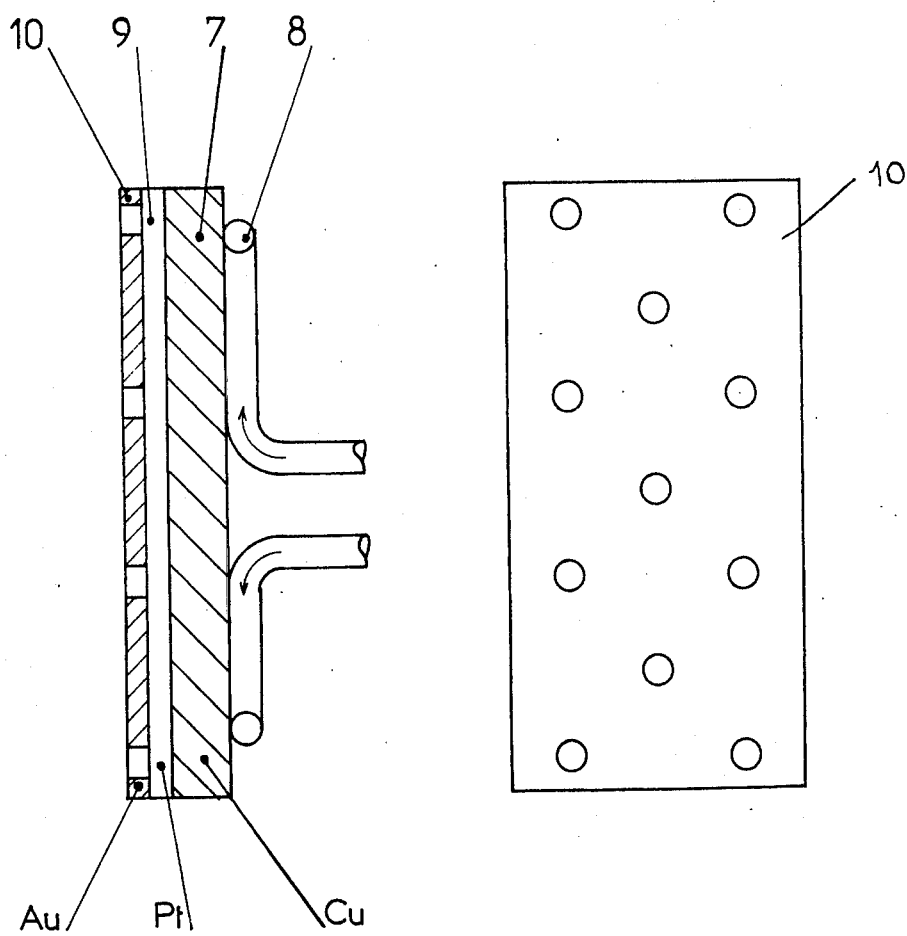

The invention will be more readily understood on referring to the description given hereinbelow and to the figures which accompany it and which are given by way of a non limitative example and in which:

FIGS. 1, 2 and 3 are views in section of a circuit on which contacts according to the invention have been established, FIG. 4 is a block diagram of the various manufacturing steps, FIG. 5 is an embodiment of a target employed for depositing the contact sublayer.

Referring to FIG. 1, reference numeral 1 designates the substrate, generally of glass or of alumina, on which the thin film is to be coated. It is assumed, by way of non limitative example, that contacts on a tantalum nitride resistor circuit coated on a glass substrate are to be produced. A layer 2 of tantalum oxide is coated on the substrate intended essentially to protect it against the reagents subsequently utilized for etching the circuit. The layer or film or tantalum pentoxide may be produced by reactive cathode sputtering of a tantalum target in a vessel in which is established a low pressure of oxygen (as is well known). It is known that this protective layer is unnecessary when the substrate is made of alumina. The operator then proceeds to depositing the layer of tantalum nitride 3 which is intended to constitute the resistor circuit. This layer is obtained for example by reactive cathode sputtering from the same tantalum target in an atmosphere of nitrogen. The thickness of the layers 2 and 3 is of the order of 0.1 micrometer. Then, according to the invention, the operator proceeds to depositing the adhesion sub layer 4 by sputtering, preferably in the same vessel, of a target constituted for example by a gold-platinum alloy comprising between 5 and 10% of platinum. The said target may occupy the position of the second target in a sputtering apparatus the first tantalum target of which served for layers 2 and 3. FIG. 5 shows an embodiment of the target.

The layers 2, 3 and 4 constitute the assembly of the layers necessary for the manufacture of the resistive circuit and localization of the contact studs. The subsequent operations no longer require the use of a sputtering apparatus. They consist, in fact, essentially in etching operations on the one hand of the gold-platinum layer for the purpose of localizing the contacts and, on the other hand, of the tantalum nitride layer for the purpose of forming the resistive pattern. Thickening of the studs with gold is effected by an electrolytic depositing operation.

FIG. 2 shows, in diagrammatic manner, the etching of the layer 4 which comprises a sequence of operations well known to the person skilled in the art. A photosensitive layer 5 is coated on top of layer 4 and is subsequently exposed to light through a photographic mask in such manner that there only remain after washing those portions of the layer 5 which protect the contact studs. The layer 4 is then etched by an appropriate reagent to remove the layer except where protected. One of the usual reagents is a mixture of iodine and potassium iodide. After etching, there is obtained the structure shown in FIG. 3, comprising the substrate 1, protective layer of tantalum oxide 2, layer of tantalum nitride 3, and the localized contacts $4_1$ and $4_2$ respectively. Etching of the resistive pattern through partial removal of layer 3 is obtained by any known process (for example the process described in U.S. Pat. No. 3,793,175), such as photoetching through a photomask and subsequently removing said photomask. Thickening of the contact studs $4_1$ and $4_2$ with gold is effected in a bath of potassium aurocyanide as shown at $6_1$ and $6_2$. Those zones of the surface which are not to receive gold are protected by a photoresist layer the same as the layer 5 which acts as a mask also during etching of layer 4. It is then removed with the aid of an appropriate solvent (as is known). When the interconnections are produced by thermocompression, it has been found that a gold thickness of 0.5 μm yielded good results. The contacts produced in accordance with the invention also afford extremely reliable behaviour in the case of tin soldering. In fact, the dissolution of the studs thus formed in the soldering bath remains extremely slight, so that it becomes possible to mount circuit components by refusion. The mounting of components, for example active components, by formation of gold-base eutectics (such as for example the Au-Si eutectic) also yields good results with contact studs according to the invention.

The circuits produced according to the invention afford ohmic contacts of extremely high electrical and mechanical quality, which show a particularly low ageing variation both with regard to mechanical contact and also to the contact resistor value.

A gold wire, 25 microns in diameter, soldered or welded by thermocompression on the contact produced in accordance with the invention withstands a traction stress of 6 g.

FIG. 4 shows the various stages of the manufacture of the contact studs according to the invention; at 10 there is shown the preparation of the substrate, consisting essentially of cleansing. The following stage 11 corresponds to cathode sputtering of the layers 2, 3 and 4 in a double target apparatus. At 12 are shown the operations for the etching of the contact studs, at 13 the operations for etching the thin film circuit; at 14 the electrolytic thickening of the contact studs.

FIG. 5 shows an embodiment of a target utilisable for the formation of the Au-Pt adhesion sublayer according to the invention; it essentially comprises a copper block 7 cooled by water circulation as shown at 8. The copper block serves essentially as a heating element. It supports a platinum layer 9, itself covered with a sheet of gold 10 pierced with apertures uniformly distributed over the surface. The ratio of the total surface of the apertures to that of the sheet permits monitoring the percentage of platinum in the layer. Since platinum has an atomisation or sputtering coefficient lower than that of gold, it is preferable to dispose the gold forwardly of the platinum (as viewed from the cathode), in order to prevent pollution of the gold target by the platinum. A minimum thickness of the gold sheet 10 of 2mm permits channeling of the platinum particles torn off by the electrons and focusing thereof onto the substrate.

Experimental conditions which produce good results when utilizing such a target are as follows: target-substrate distance $\overline{X}$ 5 cm; voltage of the target-1000 V; temperature of the substrate $\overline{X}$ 200° C; pressure in the enclosure $\overline{X}$ $2.10^{-3}$ torr of argon; duration of the operation $\overline{X}$ 10 minutes.

What we claim:

1. process for establishing contact studs on thin film resistor circuits coated on an insulating substrate, which comprises:
   cleaning said substrate.
   depositing $Ta_2$ films thereon to constitute the circuit;
   cathode sputtering a gold-platinum alloy layer on the surface of said films;
   photoetching said gold-platinum layer through a mask protecting said stud locations;
   photoetching said thin film circuit through a photo mask and
   removing said photo mask and electrolytically thickening said studs with gold.

2. Process according to claim 1 in which said gold-platinum alloy contains between 5 and 10% of platinum.

3. Process according to claim 1 in which the thickness of the layer of said gold-platinum alloy is between 0.1 and 0.2 micrometer.

4. Process according to claim 1 in which the circuit film deposition is achieved by cathode sputtering.

5. Process according to claim 1 in which the gold-platinum layer is obtained by cathode sputtering of a perforated gold sheet placed on top of a platinum foil.

6. A thin film resistor circuit including interconnecting studs made according to claim 1.

* * * * *

UNITED STATES PATENT OFFICE
CERTIFICATE OF CORRECTION

PATENT NO. : 4,025,404
DATED : May 24, 1977
INVENTOR(S) : Jean Joly; Jean Bernard Ranger It is certified that error appears in the above-identified patent and that said Letters Patent are hereby corrected as shown below:

Column 4, lines 20-23 inclusive, cancel "$\overline{X}$" each occurrence, and substitute a hyphen (-).

Signed and Sealed this

Eighteenth Day of October 1977

[SEAL]

Attest:

RUTH C. MASON
*Attesting Officer*

LUTRELLE F. PARKER
*Acting Commissioner of Patents and Trademai*